(12) United States Patent
Seroff (10) Patent No.: US 8,587,088 B2
(45) Date of Patent: Nov. 19, 2013

(54) SIDE-MOUNTED CONTROLLER AND METHODS FOR MAKING THE SAME

(75) Inventor: Nicholas Seroff, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 24 days.

(21) Appl. No.: 13/030,115

(22) Filed: Feb. 17, 2011

(65) Prior Publication Data

US 2012/0211867 A1 Aug. 23, 2012

(51) Int. Cl.
*H01L 27/02* (2006.01)
*H01L 23/52* (2006.01)
*H01L 21/98* (2006.01)

(52) U.S. Cl.
USPC ............ 257/532; 257/E23.141; 257/E27.009; 257/E21.705; 257/528; 257/535; 257/536; 257/777; 257/685; 257/686; 257/723; 257/728; 257/773; 257/774; 257/705; 257/529; 257/530; 257/533; 257/534

(58) Field of Classification Search
USPC ........ 257/532, 528, 535, 536, 531, 777, 685, 257/686, 723, 728, 773, 774, E21.705, 257/E27.009, E23.141, 529, 530, 533, 534
See application file for complete search history.

(56) References Cited

U.S. PATENT DOCUMENTS

| | | | |
|---|---|---|---|
| 3,812,402 A | 5/1974 | Garth | |
| 5,891,761 A | 4/1999 | Vindasius et al. | |
| 6,538,333 B2 | 3/2003 | Kong | |
| 7,230,317 B2* | 6/2007 | Pearson et al. | 257/532 |
| 7,259,740 B2* | 8/2007 | Haga et al. | 345/98 |
| 7,663,231 B2 | 2/2010 | Chang et al. | |
| 7,666,711 B2* | 2/2010 | Pagaila et al. | 438/114 |
| 7,723,144 B2* | 5/2010 | Chen | 438/50 |
| 7,741,156 B2* | 6/2010 | Pagaila et al. | 438/113 |
| 7,989,960 B2* | 8/2011 | Shinohara et al. | 257/777 |
| 8,001,513 B2* | 8/2011 | Silvestri | 716/126 |
| 8,164,159 B1* | 4/2012 | Armstrong et al. | 257/531 |
| 8,179,730 B2* | 5/2012 | Shimizu et al. | 365/189.09 |
| 2002/0185725 A1 | 12/2002 | Moden et al. | |
| 2003/0042153 A1 | 3/2003 | Farrar et al. | |
| 2003/0042599 A1 | 3/2003 | Farrar | |
| 2003/0230802 A1* | 12/2003 | Poo et al. | 257/734 |
| 2005/0046034 A1 | 3/2005 | Farrar | |
| 2005/0157557 A1* | 7/2005 | Perlov et al. | 365/185.21 |
| 2007/0252262 A1 | 11/2007 | Robinson et al. | |
| 2007/0278641 A1 | 12/2007 | Trezza | |
| 2007/0284716 A1 | 12/2007 | Vindasius et al. | |
| 2007/0290377 A1 | 12/2007 | Vindasius et al. | |
| 2008/0017971 A1 | 1/2008 | Hollis | |
| 2008/0147968 A1 | 6/2008 | Lee et al. | |
| 2008/0224279 A1 | 9/2008 | Caskey et al. | |
| 2008/0303131 A1 | 12/2008 | McElrea et al. | |
| 2008/0315407 A1 | 12/2008 | Andrews, Jr. et al. | |
| 2008/0315434 A1 | 12/2008 | McElrea et al. | |
| 2009/0014860 A1* | 1/2009 | Liu et al. | 257/686 |
| 2009/0065916 A1 | 3/2009 | Crane et al. | |
| 2009/0068790 A1 | 3/2009 | Caskey et al. | |
| 2009/0102038 A1 | 4/2009 | McElrea et al. | |

(Continued)

*Primary Examiner* — A O Williams
(74) *Attorney, Agent, or Firm* — Van Court & Aldridge LLP (57) ABSTRACT

A die package having a vertical stack of dies and side-mounted circuitry and methods for making the same are disclosed, for use in an electronic device. The side-mounted circuitry is mounted to a vertical surface of the stack, as opposed to a top surface or adjacent of the stack to reduce the volume of the NVM package.

25 Claims, 8 Drawing Sheets

(56) References Cited

U.S. PATENT DOCUMENTS

| | | |
|---|---|---|
| 2009/0194768 A1 | 8/2009 | Leedy |
| 2009/0206458 A1 | 8/2009 | Andrews, Jr. et al. |
| 2009/0230528 A1 | 9/2009 | McElrea et al. |
| 2009/0315174 A1 | 12/2009 | Co et al. |
| 2010/0052087 A1 | 3/2010 | McElrea et al. |
| 2010/0117224 A1 | 5/2010 | McElrea et al. |
| 2010/0140811 A1 | 6/2010 | Leal et al. |
| 2010/0162065 A1 | 6/2010 | Norman |
| 2010/0230825 A1 | 9/2010 | von Kaenel |
| 2010/0327461 A1 | 12/2010 | Co et al. |
| 2011/0012246 A1 | 1/2011 | Andrews, Jr. et al. |
| 2011/0037159 A1 | 2/2011 | McElrea et al. |
| 2011/0062596 A1* | 3/2011 | Murayama et al. ............ 257/777 |
| 2011/0101505 A1 | 5/2011 | Co et al. |
| 2011/0115099 A1 | 5/2011 | Karnezos |
| 2011/0147943 A1 | 6/2011 | McElrea et al. |
| 2011/0175222 A1* | 7/2011 | Kim et al. ..................... 257/738 |
| 2011/0266684 A1 | 11/2011 | Leal |
| 2011/0272825 A1 | 11/2011 | McGrath et al. |
| 2012/0025364 A1* | 2/2012 | Hoshino et al. ............... 257/686 |
| 2012/0119385 A1 | 5/2012 | Co et al. |
| 2012/0248607 A1 | 10/2012 | Barrie et al. |
| 2013/0099392 A1 | 4/2013 | McElrea et al. |

\* cited by examiner

SIDE-MOUNTED CONTROLLER AND METHODS FOR MAKING THE SAME

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

The flash memory exists in the form of a silicon die, and in some implementations, more than one die may be used. Multiple die implementations provide greater mass storage capacity, but it may also require additional real estate and associated supporting electronics such as busses, control circuitry, and power circuitry. In addition, the control circuitry can be placed on top of a stack multiple dies or on a printed circuit board adjacent to the dies, both of which can increase the overall space requirements of the system.

SUMMARY OF THE DISCLOSURE

A die package having a vertical stack of dies and side-mounted circuitry and methods for making the same are disclosed. The side-mounted circuitry is mounted to a side region such as a vertical surface of the stack, as opposed to a top surface of the stack to reduce the height of the NVM package.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

A die package having a vertical stack of dies and side-mounted control circuitry and methods for the production thereof are provided. The stacking of the dies can result in vertical surfaces (or walls) that are perpendicular and/or oblique to the top and bottom surfaces of the stack. These vertical surfaces serve as real estate on which various side-mounted circuitry can be mounted. As defined herein, a vertical surface can be any side of the vertical stack, and the vertical surface can be perpendicular to the top and bottom surfaces or it can be non-perpendicular with respect to the top and bottom surfaces. In accordance with embodiments of this invention, side-mounted circuitry can be mounted to a portion of one or more of the vertical surfaces. Side mounting the circuitry can reduce the height and footprint of the NVM package. Such reductions can advantageously serve design criteria requiring decreased volume of electronic devices, while simultaneously providing the same or increased storage capacity.

Figure 1:
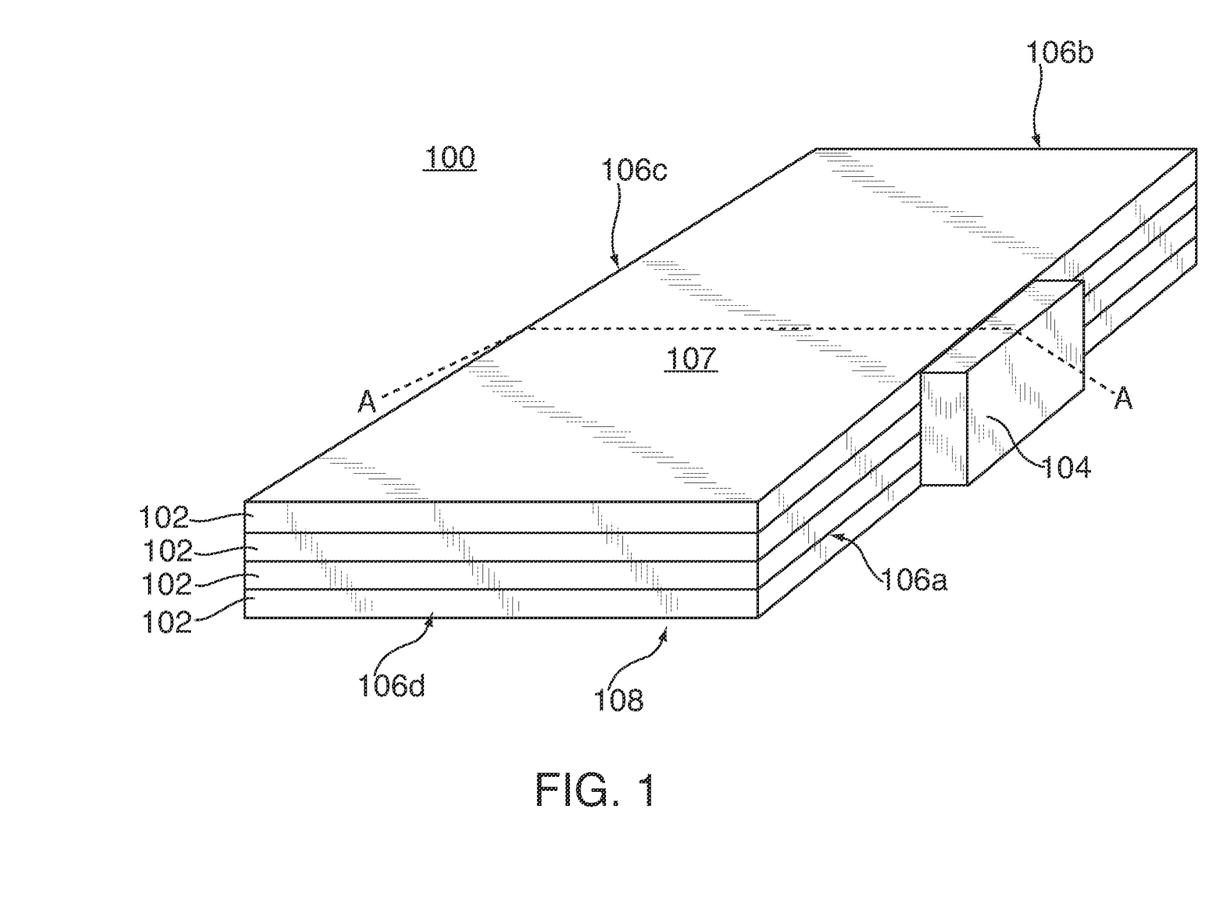
FIG. 1 shows an illustrative perspective view of a non-volatile memory package in accordance with various embodiments of the invention.

Turning now to FIG. 1, an illustrative perspective view of NVM package 100 constructed according to an embodiment is shown. NVM package 100 can include a vertical stack of NVM dies 102 and side-mounted circuitry 104. Side-mounted circuitry 104 can be mounted on a portion of one of vertical surfaces 106a-d). As shown in FIG. 1, for example, circuitry 104 is mounted on vertical surface 106a. In other embodiments, circuitry 104 can be mounted on two or more of vertical surfaces 106a-d.

Each die of NVM dies 102 can be substantially rectangular in shape (e.g., rectangular or square), and thus can have a length, width, top surface, bottom surface, side surfaces, and edges. Although only four dies are shown in FIG. 1, persons skilled in the art will appreciate that any suitable number of NVM dies 102 can be stacked to form a vertical stack (e.g., 8 or 16 NVM dies). Vertical surfaces 106a-d are formed by the aggregation of the side surfaces of each die 102. Thus, as the number of dies 102 in the stack increases, the area of vertical surfaces 106a-d increases correspondingly. Vertical surfaces 106a-d are distinct from top surface 107 and bottom surface 108 of NVM package 100.

Dies 102 can include a NAND flash memory based on floating gate or charge trapping technology (e.g., each of dies 102 can be a NAND flash die), NOR flash memory, EPROM, EEPROM, Ferroelectric RAM ("FRAM"), or magnetoresistive RAM ("MRAM"). Dies 102 can be a "raw" NAND and as such includes single-level cells ("SLCs") and/or multi-level cells ("MLCs") for storing data, address lines (e.g., word lines), addressing circuitry for accessing the SLCs or MLCs, and other die specific circuitry such as charge pumps.

It should be understood that although dies 102 are referred to herein as NAND flash memory dies, dies 102 can be any other suitable silicon based product. For example, dies 102 can be volatile memory dies such as DRAM or SRAM. As another example, dies having different functionality can be stacked. For instance, a stack can include a system-on-chip ("SOC") die, a DRAM die, and NAND die, and side-mounted circuitry can be mounted to a side of the stack.

Figure 6A:
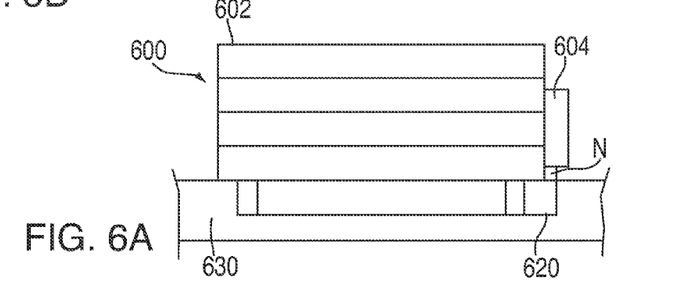
FIG. 6A-B show illustrative views of a die package in accordance with various embodiments of the invention.
Figure 6B:
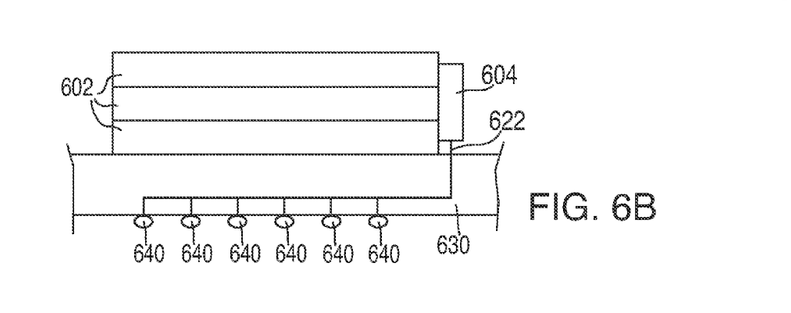

Side-mounted circuitry 104 can have any suitable shape such as, for example, a rectangular shape or a square shape. Side-mounted circuitry 104 can perform any suitable operations with respect to dies 102. That is, the functionality of side-mounted circuitry 104 may depend on the product embodied in dies 102. In one embodiment, side-mounted circuitry 104 can serve as control circuitry or a controller for NVM package 100. Side-mounted circuitry 104 can be configured to access memory locations of one or more of NVM dies 102. For example, side-mounted circuitry 104 can be configured to perform any number of NVM operations and can include an interface for communication with NVM dies 102 and circuitry located remote to NVM package 100. The NVM operations can include operations for providing a complete managed NAND solution such as maintaining translation tables, and/or performing wear leveling, refresh events, error correction, and garbage collection. Alternatively, the NVM operations executed by circuitry 104 can include a subset of the complete managed NAND operations, and execution of this subset may be referred to herein as a simplified managed NAND solution. Additional details of various control circuitry functions are discussed below in connection with FIG. 6.

In another embodiment, if dies 102 are volatile memory dies, side-mounted circuitry can serve as a control circuitry for controlling volatile memory. In yet another embodiment, the dies include a mixture of SOC, DRAM, and NVM dies, side-mounted circuitry 104 can be power management circuitry. In yet another embodiment, side-mounted circuitry can include one or more passive components such as resistors or capacitors.

Side-mounted circuitry 104 can be mounted on any one of vertical surfaces 106a-d of the vertical stack of NVM dies 102. As shown in FIG. 1, for example, circuitry 104 can be mounted on vertical surface 106a of the vertical stack. Depending on the size of circuitry 104 relative to the height of each of dies 102, such a mounting configuration may cause circuitry 104 to extend across one or more of NVM dies 102.

By mounting circuitry 104 to the vertical stack in such a manner, the height specification of NVM package 100 is reduced because the mounting of circuitry 104 takes advantage of the existing height of the vertical stack. Thus, in contrast to mounting circuitry 104 on top of the vertical stack of dies 102, or on a printed circuit board adjacent to the stack, the footprint and height are reduced.

Figure 2A:
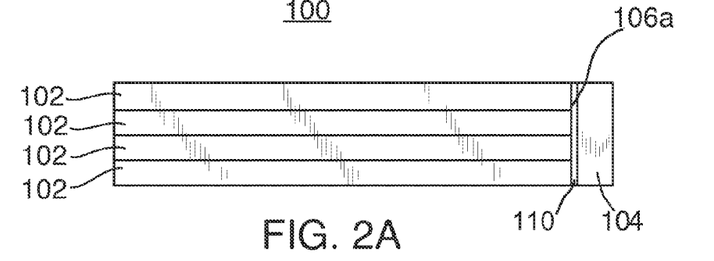
FIGS. 2A-D show an illustrative cross-sectional views of various non-volatile memory packages in accordance with various embodiments of the invention.

Referring now to FIG. 2A, an illustrative cross-sectional view of NVM package 100 taken along the lines A-A of FIG. 1 is shown. FIG. 2A shows dies 102 stacked in a vertical fashion with side-mounted circuitry 104 mounted to vertical surface 106a. Circuitry 104 can be mounted to vertical surface 106a using any suitable mounting technique. For example, adhesive layer 110 disposed between circuitry 104 and vertical surface 106a may secure circuitry 104 to the vertical stack. As another example, an insulation or dielectric layer (not shown) may be disposed between each die 102 to provide electrical isolation among dies 102.

Each of NVM dies 102 can include custom pad and trace placements (not shown) in order to facilitate exchange of signals to, from, and/or between dies 102. The pads may be electrically coupled to control circuitry 104 via interconnection circuitry (not shown) to permit communication between side-mounted circuitry 104 and dies 102. Interconnection circuitry can be constructed from any suitable material such as, for example, conductive epoxy, wire bonds, or a combination thereof. Interconnection circuitry can take any suitable form to electrically connect circuitry 104 to dies 102.

Figure 2B:
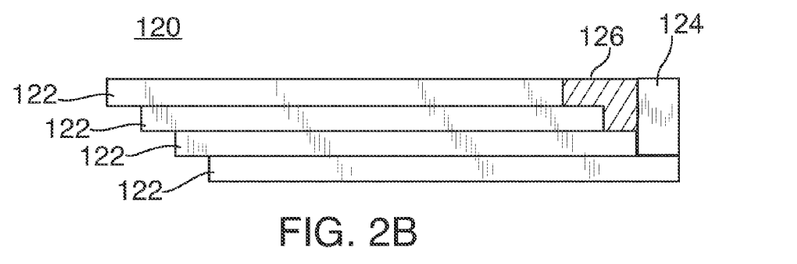

FIG. 2B shows an illustrative cross-sectional view of NVM package 120 according to an embodiment of the invention. In NVM package 120, dies 122 are arranged in a staggered configuration. As a result, the edges of dies 122 may not form a planer wall such as that shown in FIGS. 1 and 2A, but rather, a stepped wall. Adhesive 126 may be applied to fill in the gaps to provide a substantially planar wall onto which side-mounted circuitry 124 may be mounted. The amount of adhesive may vary depending on where side-mounted circuitry 124 is mounted. As shown in FIG. 2B, side-mounted circuitry 124 is mounted such that it is positioned above one of dies 122.

Figure 2C:
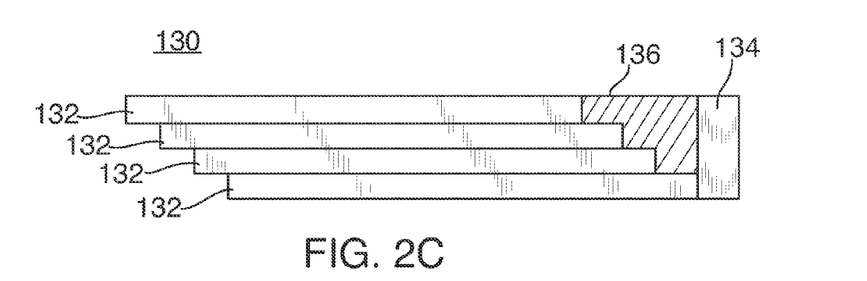

FIG. 2C shows an illustrative cross-sectional view of NVM package 130 according to an embodiment of the invention. NVM package 130 is similar in many respects to NVM package 120 of FIG. 2B, but has side-mounted circuitry 134 mounted adjacent to all dies 132. An adhesive 136 may fill in the gaps between dies 132 and side-mounted circuitry 134.

Figure 2D:
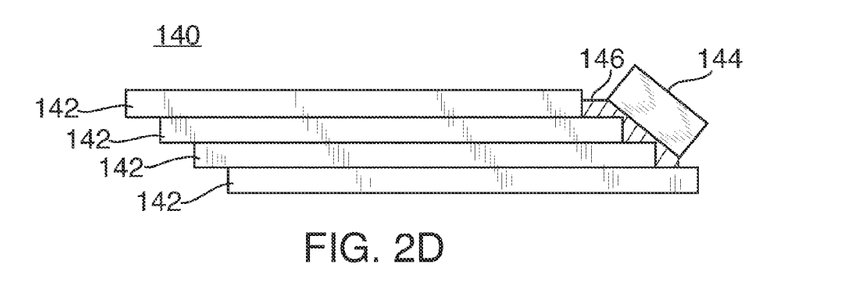

FIG. 2D shows an illustrative cross-sectional view of NVM package 140 according to an embodiment of the invention. NVM 140 is similar in many respects to NVM packages 120 and 130, but has side-mounted circuitry 144 mounted at an angle with respect to the top and bottom surfaces. Adhesive 146 may fill in the gaps between dies 142 to provide a non-perpendicular surface on which side-mounted circuitry 144 can be mounted.

Figure 3A:
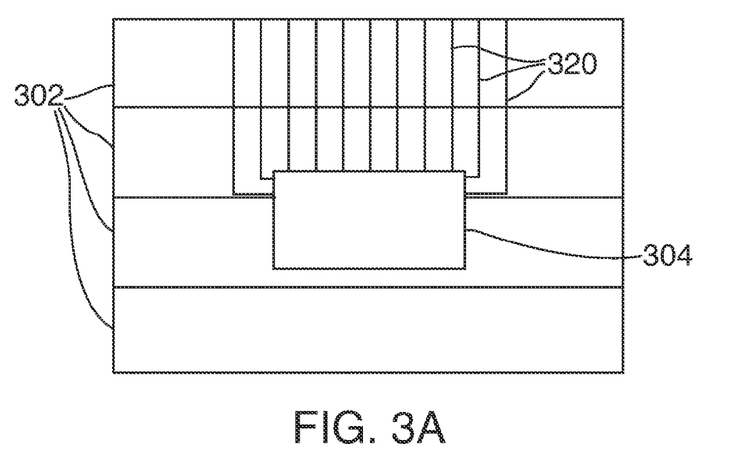
FIGS. 3A-F show illustrative views of a stacked die packages in accordance with various embodiments of the invention.
Figure 3B:
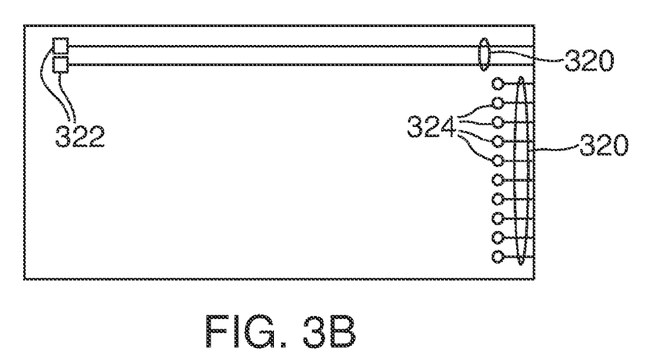
Figure 3C:
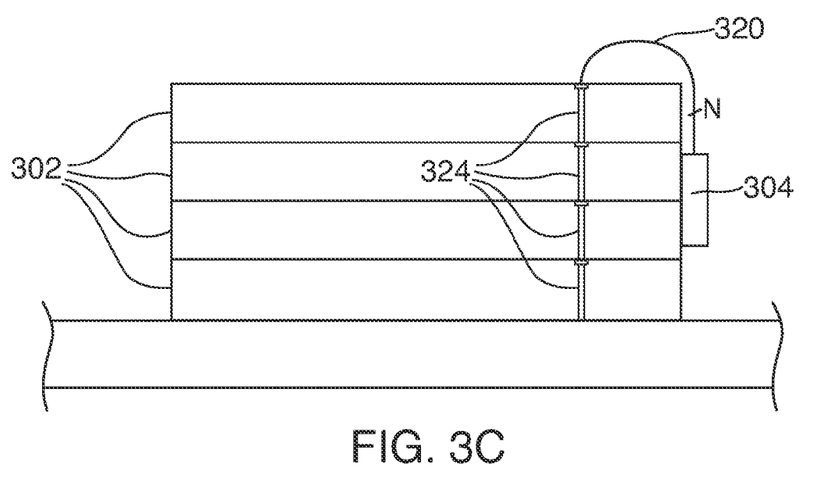

FIGS. 3A and 3B show illustrative side and top views, respectively, of a NVM package with interconnection circuitry according to an embodiment of the invention. Interconnection circuitry 320 can be routed from circuitry 304 to the top surface of the vertical stack of dies 302. On the top surface, interconnection circuitry 320 can interface with one or more pads 322, which may be associated with the top die, and "internal" vias 324, which connect to pads of the dies located beneath the top die. Internal vias are pathways that exist within the dies. The vias may be through-silicon vias. For example, FIG. 3C shows an illustrative side view of a stacked die package mounted on a substrate according to an embodiment of the invention. As shown, interconnection circuitry 320 is routed to the top of the stacked die to one of vias 324.

Figure 3D:
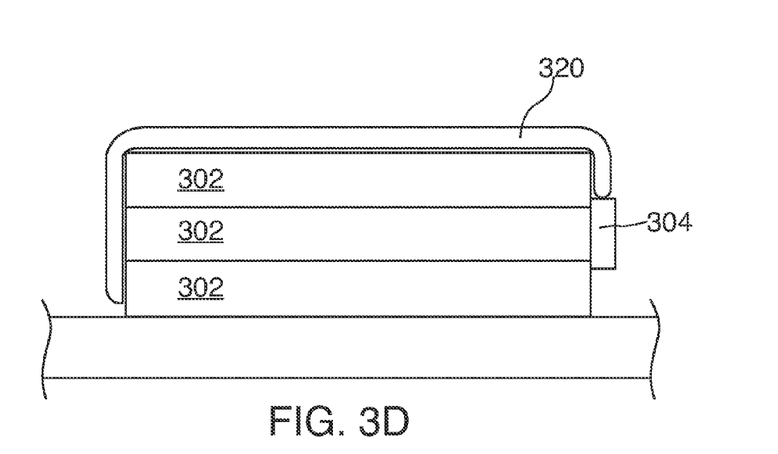
Figure 3E:
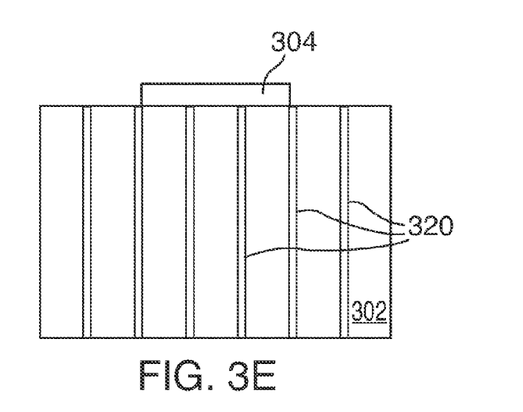
Figure 3F:
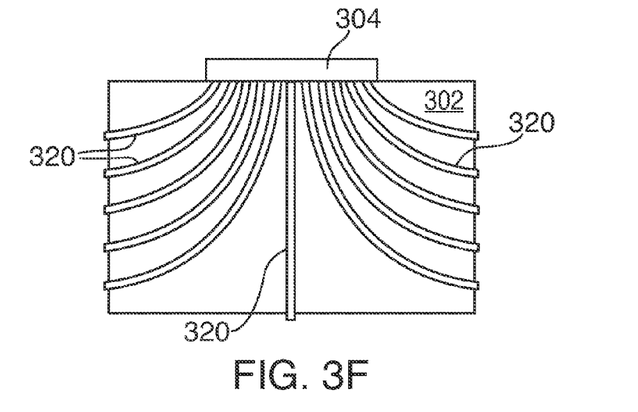

FIGS. 3D and 3E show illustrative side and top views, respectively, of a die package with interconnection circuitry according to an embodiment of the invention. As shown, interconnection circuitry 320 is a conductive epoxy that is deposited along the sides and top of the stacked die to interconnect control circuitry 304 to dies 302. FIG. 3E shows that interconnection circuitry 320 can be deposited as strips across the top of the die stack. This is merely illustrative, however, and those skilled in the art will appreciate that interconnection circuitry 320 can be deposited such it is routed to two, three, or all four sides of the stacked die. FIG. 3F illustrates how interconnection circuitry 320 can be deposited so that it interfaces with bond pads on three sides of the stacked die.

Figure 4:
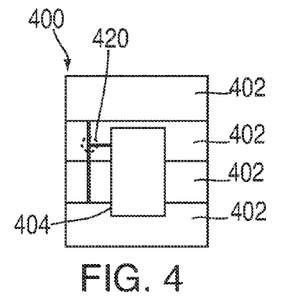
FIG. 4 shows an illustrative side view of a NVM package in accordance with various embodiments of the invention.

FIG. 4 shows an illustrative side view of a NVM package 400 with side-mounted circuitry 404 and interconnection circuitry 420 according to an embodiment of the invention. Interconnection circuitry 420 is electrically coupled to each of dies 402 on the same side of NVM package 400 that side-mounted circuitry 404 is mounted. For example, interconnection circuitry 420 can connect to pads or connectors on dies 402.

Figure 5A:
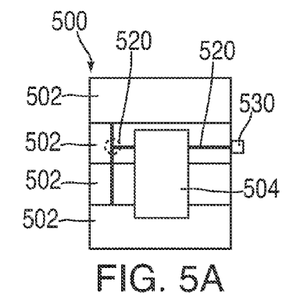
FIGS. 5A and 5B show illustrative side views of a NVM package in accordance with various embodiments of the invention.
Figure 5B:
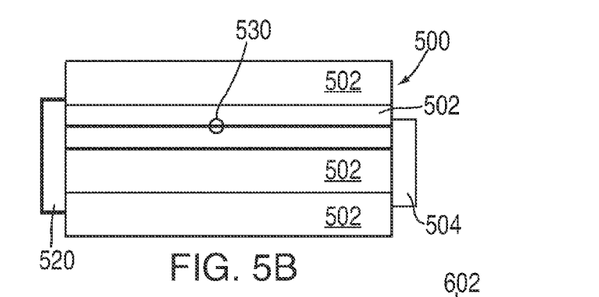

FIGS. 5A and 5B show illustrative side views of a NVM package 500 with side-mounted circuitry 504 and interconnection circuitry 520 according to an embodiment of the invention. Interconnection circuitry 520 is electrically coupled to dies 502 on at least two sides of NVM package 500. As shown, interconnection circuitry 520 exist on opposite sides of NVM package 500 and are connected together by bus 530.

FIG. 6A shows an illustrative view of interface circuitry 620 being routed through a substrate 630 to dies 602 of NVM package 600. Substrate 630 can be, for example, a printed circuit board. Interconnection circuitry 620 is routed from side-mounted controller 604 through one or more layers of substrate 630 to NVM package 600. Interconnection circuitry 620 may interface with dies 602 at access points (a few of which are shown) where NVM package 600 abuts substrate 630. For example, interface circuitry 620 may connect to vias (not shown).

FIG. 6B shows an illustrative view of interface circuitry 622 being routed through substrate 630 to bond pads 640 that are connected to a host (not shown). Thus, FIG. 6B shows an example of how side-mounted controller can be connected to a host (e.g., host processor 910 of FIG. 9).

Figure 7A:
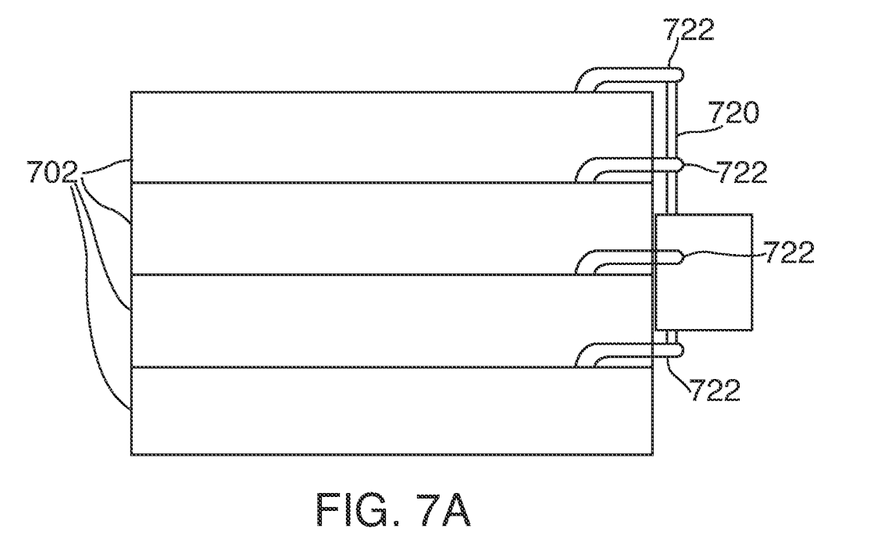
FIGS. 7A and 7B show illustrative side and top views of a NVM package in accordance with various embodiments of the invention.
Figure 7B:
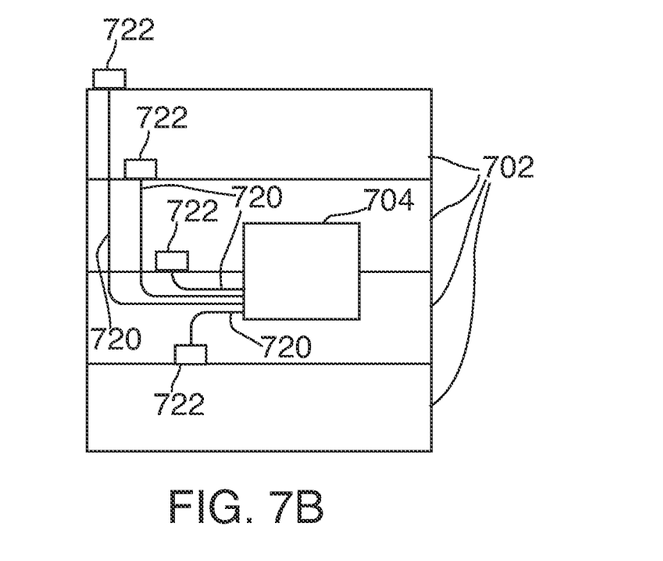
Figure 8:
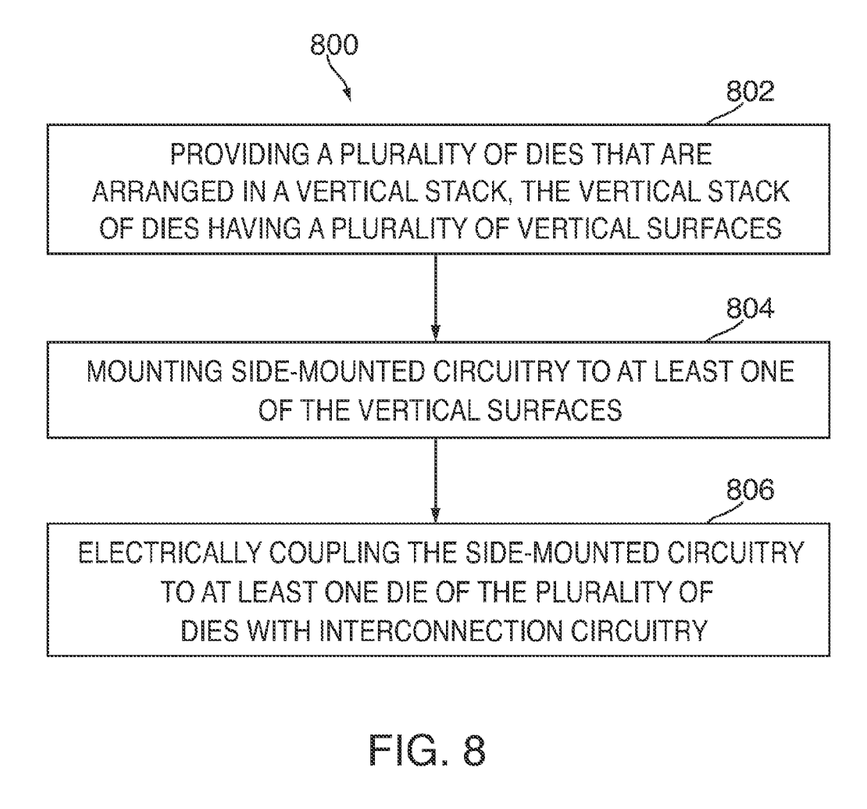
FIG. 8 shows a flowchart of an illustrative process for making a NVM package having side-mounted control circuitry in accordance with various embodiments of the invention.

FIGS. 7A and 7B show illustrative side and top views, respectively, of a NVM package with side-mounted circuitry 704 and interconnection circuitry 720 according to an embodiment of the invention. Interconnection circuitry 720 may interface with conductors 722 that protrude outwards away from the side of one or more dies 702. These outward-protruding conductors 722 may be electrically coupled to pads of dies, thereby eliminating the need for "internal" vias. Thus, any electrical coupling with the protruding conductors is made external to the dies. In yet another embodiment, interconnection circuitry can interface with a combination of internal vias and protruding conductors FIG. 8 shows a flowchart of an illustrative process 800 for making a package having side-mounted control circuitry according to an embodiment of the invention. Beginning at step 802, a plurality of dies are mounted to each other to form a vertical stack of dies. The dies can be NVM dies or volatile memory dies. In some embodiments, the dies can be a mixture of processor die, NVM die, and volatile memory die. The stack of dies has a top surface, a bottom surface, and several vertical surfaces. Continuing to step 804, side-mounted circuitry can be mounted to one of the vertical surfaces of the vertical stack.

In some embodiments, a layer of adhesive and/or insulation material can function as an adhesive for mounting the control circuitry to the vertical surface of the vertical stack. Thus, in some case, the layer of adhesive and/or insulation material can be placed between the side-mounted circuitry and the vertical surface of the vertical stack. In other embodiments, interconnection circuitry can effectively serve as the adhesive for mounting the control circuitry to the vertical surface of the vertical stack. In some embodiments, when the die are stacked in a staggered step configuration, the adhesive may provide a substantially planar surface onto which the side-mounted circuitry can be mounted.

Then, at step 806, the side-mounted circuitry can be electrically coupled to at least one die or to the substrate (e.g., as discussed above in connection with FIG. 6). Depending on the construction of the dies—that is whether "internal" vias, offset dies or protruding conductors are used—different interconnection circuitry may be used to electrically connect the control circuitry to the dies.

It should be understood that process 800 of FIG. 8 is merely illustrative. Any of the steps may be removed, modified, or combined, and any additional steps may be added, without departing from the scope of the invention.

Figure 9:
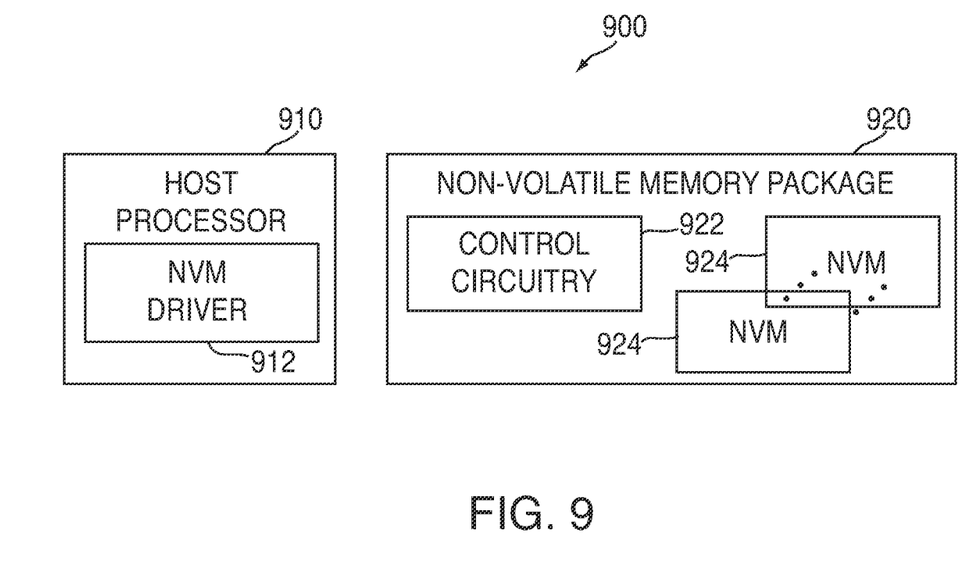
FIG. 9 shows a simplified block diagram of a system using a non-volatile memory package in accordance with various embodiments of the invention.

FIG. 9 is a simplified block diagram of system 900. System 900 can include host system which may include a processor 910, and at least one package 920 constructed according to an embodiment of the invention. Host processor 910 and package 920 can be implemented in any suitable host device or system, such as a portable media player, a cellular telephone, a pocket-sized personal computer, a personal digital assistance ("PDA"), a desktop computer, or a laptop computer. For simplicity, the host device or system, which may include host processor 910, may sometimes be referred to simply as a "host".

Host processor 910 can include one or more processors or microprocessors. Alternatively or in addition, host processor 910 can include or operate in conjunction with any other components or circuitry capable of controlling various operations of system 900 (e.g., application-specific integrated circuits ("ASICs")). In a processor-based implementation, host processor 910 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 910 can execute NVM driver 912, which may provide vendor-specific and/or technology-specific instructions that enable host processor 910 to perform various memory management and access functions for NVM package 920.

Package 920 may be a stacked NVM package constructed with side-mounted circuitry in accordance with an embodiment of the invention. In one embodiment, package 920 can be a volatile memory package. In another embodiment, package can be a NVM package. NVM package 920 may be a comprehensive managed NVM package or simplified managed NVM package. In either managed NVM implementation, NVM package 920 can include side-mounted circuitry 922, which is electrically coupled to any suitable number of NVM dies that are vertically stacked (e.g., NVM dies 102 of FIG. 1). Side-mounted circuitry 922 can be the same as or similar to side-mounted circuitry 104 of FIG. 1.

Side-mounted circuitry 922 may include any suitable combination of processors or hardware-based components (e.g., ASICs), and may include the same components as or different components from host processor 910. In the simplified managed NVM package, side-mounted circuitry 922 may share the responsibility of managing and/or accessing the physical memory locations of NVM dies 924 with NVM driver 912. For example, NVM driver 912 can perform all management functions except error correction, which is performed by side-mounted circuitry 922.

In the comprehensive managed NVM package, side-mounted circuitry 922 may perform substantially all of the management and access functions for NVM dies 924 independent of host processor 910. In this approach, circuitry 922 can pass data retrieved from NVM dies 924 to host processor 910. Comprehensive managed NVM packages can be found, for example, in USB thumb drives.

NVM dies 924 may be used to store information that needs to be retained when system 900 is powered down. NVM dies 924 can be organized into "blocks," which are the smallest units of erase, and further organized into "pages," which are the smallest programmable and readable units. In some embodiments, the blocks from different dies may form "super blocks." Each memory location (e.g., page or block) of NVM dies 924 can be addressed using a physical address (e.g., a physical page address or physical block address).

The described embodiments of the invention are presented for the purpose of illustration and not of limitation.

What is claimed is:

1. A package, comprising:
   a plurality of dies arranged in a vertical stack, the stack having a top surface, a bottom surface, and at least one vertical surface;
   side-mounted control circuitry mounted to one of the at least one vertical surface, wherein the dies are non-volatile memory dies, and the side-mounted control circuitry is a non-volatile memory controller; and
   interconnection circuitry that electrically couples the control circuitry to at least one of the dies.

2. The package of claim 1, wherein the interconnection circuitry comprises conductive epoxy.

3. The package of claim 1, wherein the interconnection connection circuitry comprises a plurality of wire bonds.

4. The package of claim 1, further comprising an adhesive layer disposed between the control circuitry and the vertical surface to which the control circuitry is mounted.

5. The package of claim 1, wherein the plurality of dies have a rectangular shape, and each die has four sides, the stacked aggregation of which forms the at least one vertical surface.

6. The package of claim 1, wherein the plurality of dies are stacked in a staggered configuration, and an adhesive exists between the side-mounted control circuitry and the dies.

7. The package of claim 1, wherein the stacked dies comprise die pads and/or vias, and wherein the interconnection circuitry is electrically coupled to the die pads and/or vias.

8. The package of claim 1, wherein at least one of the dies comprises a conductor that protrudes away from a side of that at least one die, and wherein the interconnection circuitry is electrically coupled to the conductor.

9. The package of claim 8, wherein the conductor is electrically coupled to a pad associated with one of the dies.

10. A package mounted to a substrate, comprising:
a plurality of dies arranged in a vertical stack, the stack having a top surface, a bottom surface, and at least one vertical surface, wherein the bottom surface is mounted to a top surface of the substrate;
side-mounted control circuitry mounted to one of the at least one vertical surface; and
interconnection circuitry that electrically couples the control circuitry to at least one of the dies and to at least one bond pad located in the substrate, wherein the dies are volatile memory dies, and the side-mounted control circuitry is a volatile memory controller.

11. The package of claim 1, wherein the interconnection circuitry comprises through-silicon vias.

12. The package of claim 1, wherein one or more of the dies are digital or analog semiconductor devices.

13. The package of claim 1, wherein the side-mounted control circuitry comprises a passive component.

14. The package of claim 13, wherein the passive component is a resistor or a capacitor.

15. A method for making a stacked die package, the method comprising:
providing a plurality of dies that are arranged in a vertical stack, the vertical stack of dies having a plurality of vertical surfaces;
mounting side-mounted control circuitry to at least one of the vertical surfaces, wherein the side-mounted control circuitry comprises a passive component; and
electrically coupling the side-mounted circuitry to at least one die of the plurality of dies with interconnection circuitry.

16. The method of claim 15, further comprising placing a dielectric material between each of the plurality of dies to electrically isolate the plurality of dies from each other.

17. The method of claim 15, further comprising placing a layer of adhesive between the side-mounted circuitry and the vertical surface to which the side-mounted circuitry is mounted.

18. The method of claim 15, wherein the interconnection circuitry comprises conductive epoxy or wire bonds.

19. The method of claim 15, wherein each of the plurality of dies is a NAND flash die.

20. A system comprising:
a processor;
a non-volatile memory ("NVM") package in operative communication with the processor, the NVM package comprising:
a plurality of NVM dies arranged in a vertical stack, the stack having a top surface, a bottom surface, and a plurality of vertical surfaces, wherein the plurality of dies are non-volatile memory dies;
side-mounted non-volatile memory (NVM) controller circuitry mounted to one of the vertical surfaces; and
interconnection circuitry that electrically couples the side-mounted (NVM) controller circuitry to at least one of the dies, wherein, the side-mounted (NVM) controller circuitry is operative to perform at least one NVM management operation with respect to data stored in and/or retrieved from the NVM package.

21. The system of claim 20, wherein the at least one NVM management operation comprises error code correction.

22. The system of claim 20, wherein the at least one NVM management operation comprises translating an instruction received from the processor to an instruction that can be processed by the NVM package.

23. The system of claim 20, wherein the side-mounted non-volatile memory controller circuitry is operative to access memory locations of the plurality of dies.

24. The system of claim 20, wherein the side-mounted circuitry is first side-mounted non-volatile memory controller circuitry that is mounted to a first vertical surface, the NVM package further comprising:
second side-mounted circuitry mounted to a second vertical surface.

25. The system of claim 24, wherein the first side-mounted circuitry is operative to access memory locations of the plurality of dies and wherein the second side-mounted circuitry is operative to apply error code correction to data transmitted between the processor and the NVM package.

* * * * *

UNITED STATES PATENT AND TRADEMARK OFFICE
CERTIFICATE OF CORRECTION

| | | |
|---|---|---|
| PATENT NO. | : 8,587,088 B2 | Page 1 of 1 |
| APPLICATION NO. | : 13/030115 | |
| DATED | : November 19, 2013 | |
| INVENTOR(S) | : Nicholas Seroff | |

It is certified that error appears in the above-identified patent and that said Letters Patent is hereby corrected as shown below:

In the Claims

In Column 6, Lines 66-67, Claim 3, delete "interconnection connection circuitry" and insert -- interconnection circuitry --, therefor.

Signed and Sealed this
Nineteenth Day of January, 2016

Michelle K. Lee
*Director of the United States Patent and Trademark Office*